United States Patent [19]

Chloupek

[11] Patent Number: 5,376,833
[45] Date of Patent: Dec. 27, 1994

[54] CURRENT DRIVER CIRCUIT
[75] Inventor: James E. Chloupek, Plano, Tex.
[73] Assignee: Texas Instruments Incorporated, Dallas, Tex.
[21] Appl. No.: 989,809
[22] Filed: Dec. 11, 1992
[51] Int. Cl.⁵ .............................. H03K 17/12
[52] U.S. Cl. ........................ 327/110; 330/288; 327/108; 327/310
[58] Field of Search .......... 307/270, 241, 257, 317.2; 330/288, 257; 302/608, 522, 547, 570, 549, 296.2, 491

[56] References Cited
U.S. PATENT DOCUMENTS

| 4,697,103 | 9/1987 | Ferris et al. | 307/315 |
| 4,868,424 | 9/1989 | Bosnyak et al. | 307/549 |
| 5,144,174 | 9/1992 | Murakami | 307/608 |
| 5,200,654 | 4/1993 | Archer | 302/491 |

Primary Examiner—Timothy P. Callahan
Assistant Examiner—Dinh Le
Attorney, Agent, or Firm—Robby T. Holland; Wade J. Brady, II; Richard L. Donaldson

[57] ABSTRACT

Accordingly, an integrated control circuit is provided that allows for a central current reference circuit that supplies a reference current signal that employ a zero temperature coefficient. This current reference signal can be proportionally mirrored to a variety of output drivers to allow for a driving of peripheral systems with exact current requirements. Due to the fact that the reference current will not exhibit substantial variation with respect to temperature, the variability in the current supplies to the output drivers is small. As such, the output drivers can be designed to minimize the waste of current and power dissipation in the integrated system. Said output driver circuit (38) provides an output current to a load through an output pin. A output current mirror formed of a plurality of bipolar transistors (180, 188, and 194) provides the output current responsive to a control signal T1. A Schottky transistor (178) shunts current away from the output current mirror circuit responsive to the T1 signal to shut off the output current signal. If the output pin is pulled below ground potential by the load, the Schottky transistor (178) shuts off and the output current is reestablished preventing the activation of substrate diodes and the formation of potentially disruptive substrate currents.

12 Claims, 2 Drawing Sheets 5,376,833

1

CURRENT DRIVER CIRCUIT

TECHNICAL FIELD OF THE INVENTION

This invention relates in general to the field of electronic systems and more particularly to an improved output driver circuit.

BACKGROUND OF THE INVENTION

Integrated circuits are sometimes used to provide current drive to large inductive loads. When a large inductive load discharges, the pin connecting the integrated circuit with the load can be pulled to below ground potential. In prior systems, this negative voltage on the output pin can result in the activation of substrate diodes within the integrated driver circuit. When substrate diodes are turned on, substrate currents can result that can latch up the integrated device.

Accordingly, a need has arisen for a system that compensates for the negative voltage that can result on an output pin of an integrated current driving circuit when a large inductive load is coupled to the output pin.

SUMMARY OF THE INVENTION

In accordance with the teachings of the present invention, an output driver circuit is shown that substantially eliminates or reduces disadvantages and problems associated with prior systems.

According to one embodiment of the present invention, an output driver circuit is provided that comprises an output current mirror operable to supply output current to the load. A second current path is provided that is operable to shunt the mirror reference current away from the output current mirror when the output driver circuit is turned off. The second current path is constructed such that if the output pin falls below ground potential, the second current path will shut off and current will once again flow through the output current mirror.

An important technical advantage of the present invention inheres in the fact that the output driver circuit of the present invention will channel the current induced by the negative voltage on the output pin through active devices at voltages lower than the voltages required to actuate substrate diodes. Accordingly, the stray substrate currents common in prior systems are prevented and the risk of latch up is greatly reduced or eliminated.

BRIEF DESCRIPTION OF THE DRAWINGS

A more complete understanding of the present invention may be acquired by referring to the detailed description of the invention in conjunction with the accompanying drawings in which like reference numbers indicate like features and wherein.

2

Figure 5:
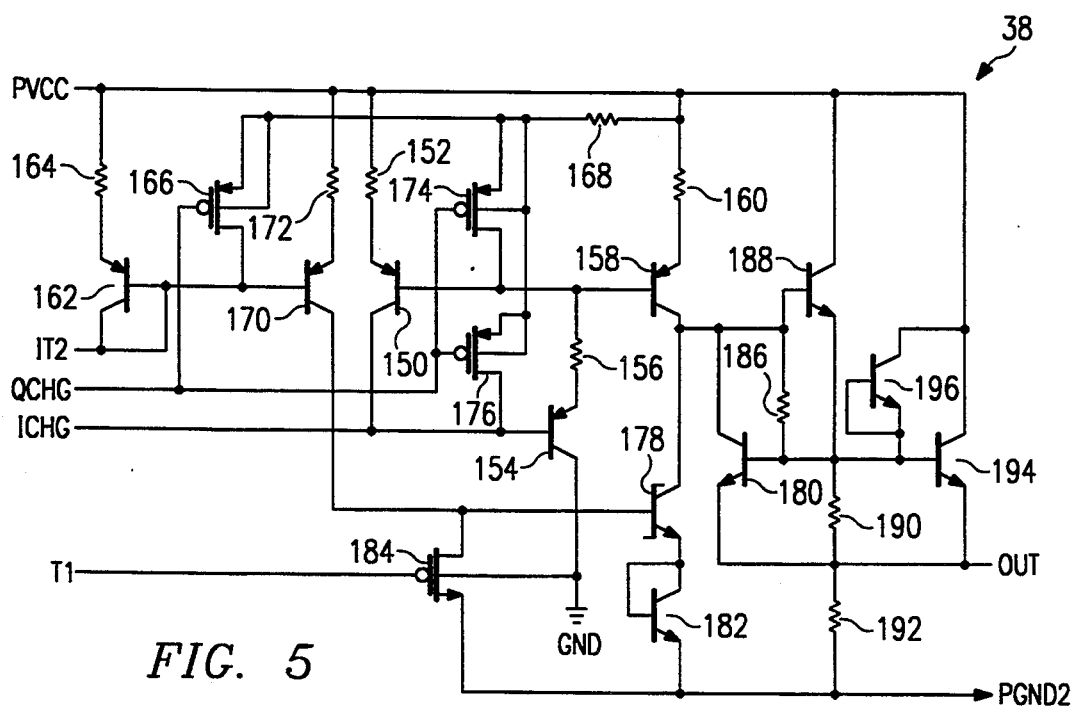

FIG. 5 is a schematic diagram of an output driver circuit constructed according to the teachings of the present invention.

DETAILED DESCRIPTION OF THE INVENTION

Figure 1:
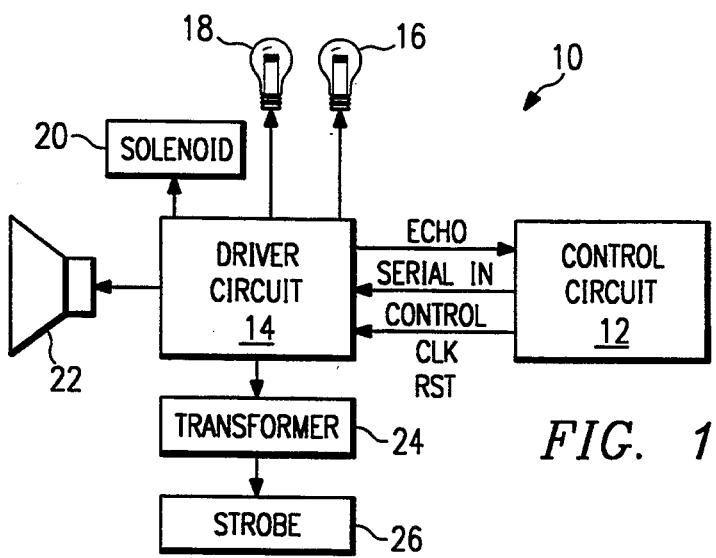
FIG. 1 is a schematic block diagram of a peripheral control circuit constructed according to the teachings of the present invention.

FIG. 1 is a schematic illustration of a control system indicated generally at 10 which comprises a control circuit 12 and a driver circuit 14. Control circuit 12 may comprise any suitable microcontroller circuit such as a Micro-370 based integrated microcontroller circuit. Control circuit 12 communicates with driver circuit 14 with a plurality of control signals including clock signals and reset signals. Driver circuit 14 provides output current to a plurality of peripheral systems. FIG. 1 illustrates first and second LEDs or lamps 16 and 18, a solenoid 20, a speaker 22, and a transformer 24. Transformer 24 can be used to drive, for example, a strobe 26 and may be driven by circuit 14 through, for example, an external NPN bipolar transistor. Each of the peripherals identified previously requires an independent predetermined level of current from driver circuit 14.

Control system 10 may be used, for example, in a consumer electronics system such as a camera. In such a system, LEDs 16 and 18 may comprise indicator lamps. Solenoid 20 may comprise an actuator to accomplish a lens change, for example. Speaker 22 may supply warning or prompting tones. Transformer 24 serves to charge the strobe 26 prior to its firing.

Driver circuit 14 receives commands from control circuit 12 through a serial data path. Driver circuit 14 returns a serial echo signal comprising a delayed copy of the data received on the serial input.

Figure 2:
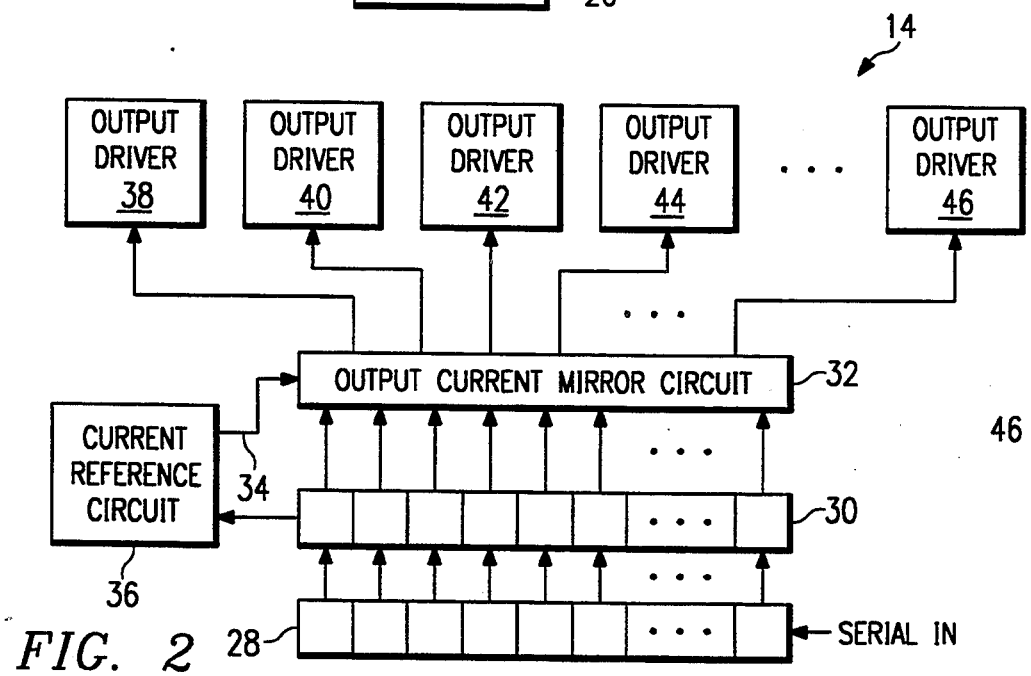
FIG. 2 is a schematic block diagram of a current driver circuit constructed according to the teachings of the present invention.

FIG. 2 is a schematic illustration of one embodiment of driver circuit 14 constructed according to the teachings of the present invention. The serial data received from control circuit 12 is input into a shift register 28. When the complete control word is received from control circuit 12, the contents of shift register 28 is transferred in parallel into a register 30. Each bit stored within register 30 supplies a control signal that is coupled to an output current mirror 32. The output current mirror circuit 32 is supplied a reference current indicated at 34 from a central current reference circuit 36. Reference current 34 is received by output current mirror circuit 32 and is used to drive a current mirror which supplies various levels of output current to output drivers 38 through 46 shown in FIG. 2. Output drivers 38 through 46 are then coupled to the peripheral systems such as those described previously with reference to FIG. 1.

According to the teachings of the present invention, the central current reference circuit 36 is constructed such that the reference current 34 supplied by central current reference circuit 36 is substantially constant independent of temperature and operating variations. In this manner, the output current mirror circuit 32 and the current supply to the output drivers 38 through 46 are also unaffected by temperature as the current mirror within central output current mirror circuit 32 is driven by the reference current 34.

The data within shift register 28 is coupled to central output current mirror circuit 32 through register 30 in order to isolate the remainder of circuit 14 from shift register 28 as new data is being shifted into shift register 28. According to the teachings of the present invention, a new control word can be input into shift register 28 without affecting the outputs until the entire control word is loaded. This structure prevents erroneous control signals from being transmitted to the output drivers 38 through 46 during the serial loading of control words into shift register 28. Current reference circuit 36 receives signals from register 30 whenever any of the bits within register 30 are active. These signals act as enabling signals to central current reference circuit 36. Accordingly, if the value stored within register 30 indicates that none of the output drivers 38 through 46 are active, the central current reference circuit 36 will also not be turned on.

Figure 3:
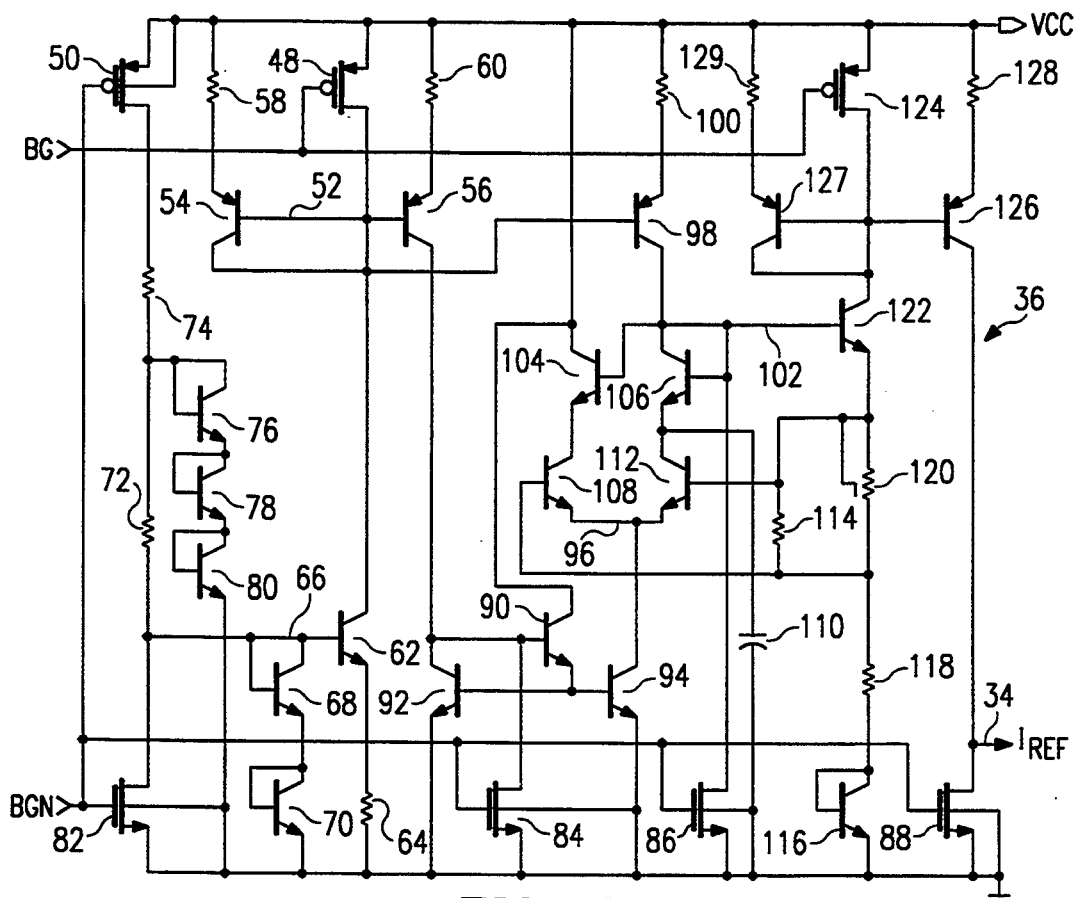
FIG. 3 is a schematic diagram of a central current reference circuit constructed according to the teachings of the present invention.

FIG. 3 illustrates a schematic of one embodiment of central current reference circuit 36 constructed according to the teachings of the present invention. The enabling signal received from register 30 is indicated as the BG signal in FIG. 3. The inverse of this signal is also supplied to circuit 36 and is designated as the BGN signal in FIG. 3. The BG signal is coupled to the gate of a p-channel transistor 48. The BGN signal is coupled to the gate of a p-channel transistor 50. The sources and backgate contacts of transistors 48 and 50 are coupled to the $V_{cc}$ supply voltage. The drain of transistor 48 is coupled to a node 52. Node 52 is coupled to the base of PNP bipolar transistors 54 and 56. The emitter of transistor 54 is coupled to a $V_{cc}$ supply voltage through a 2 kiloohm resistor 58. The emitter of transistor 56 is coupled to the $V_{cc}$ supply voltage through a 2 kiloohm resistor 60. The collector of transistor 54 is coupled to node 52. Node 52 is coupled to the collector of an NPN bipolar transistor 62. The emitter of transistor 62 is coupled to ground potential through a 10 kiloohm resistor 64. The base of transistor 62 is coupled to a node 66. Node 66 is coupled to the base and collector of an NPN bipolar transistor 68. The emitter of bipolar transistor 68 is coupled to the base and collector of an NPN bipolar transistor 70. The emitter of transistor 70 is coupled to ground potential. Node 66 is coupled to the drain of transistor 50 through the series connection of a 60 kiloohm resistor 72 and a 40 kiloohm resistor 74. The node between resistors 72 and 74 is coupled to the collector and base of an NPN bipolar transistor 76. The emitter of transistor 76 is coupled to the base and collector of an NPN bipolar transistor 78. The emitter of transistor 78 is coupled to the base and collector of an NPN bipolar transistor 80. The emitter of transistor 80 is coupled to ground potential.

The BGN signal is coupled to the gates of four n-channel MOS field effect transistors 82, 84, 86 and 88. The source and backgate contacts of n-channel transistors 82, 84, 86 and 88 are coupled to ground potential. The drain of transistor 82 is coupled to node 66.

The collector of transistor 56 is coupled to the base of an NPN bipolar transistor 90, the collector of an NPN bipolar transistor 92, and the drain of transistor 84. The emitter of transistor 92 is coupled to ground potential. The base of transistor 92 is coupled to the emitter of transistor 90 and to the base of an NPN bipolar transistor 94. The collector of transistor 90 is coupled to the $V_{cc}$ supply voltage. The emitter of transistor 94 is coupled to ground potential. The collector of transistor 94 is coupled to a node 96.

Node 52 is coupled to the base of a PNP bipolar transistor 98 which has its emitter coupled to the $V_{cc}$ supply voltage through a 2 kiloohm resistor 100. The collector of transistor 98 is coupled to a node 102. Node 102 is coupled to the drain of transistor 86. Node 102 is coupled to the base of an NPN bipolar transistor 104 and to the base and collector of an NPN bipolar transistor 106. The collector of transistor 104 is coupled to the $V_{cc}$ supply voltage. The emitter of transistor 104 is coupled to the collector of an NPN bipolar transistor 108. The emitter of transistor 108 is coupled to node 96.

The emitter of transistor 106 is coupled to ground potential through a 3.8 picofarad capacitor 110. The emitter of transistor 106 is also coupled to the collector of an NPN bipolar transistor 112. The emitter of transistor 112 is coupled to node 96. The base of transistor 112 is coupled to the base of transistor 108 through a 3,000 ohm n-well resistor 114.

The base of transistor 108 is coupled to the base and collector of an NPN bipolar transistor 116 through a 5 kiloohm resistor 118. The emitter of transistor 116 is coupled to ground potential. The base of transistor 112 is coupled to the substrate contact and one node of a 192 ohm base resistor 120. The remaining node of resistor 120 is coupled to the base of transistor 108. The base of transistor 112 is also coupled to the emitter of an NPN bipolar transistor 122. The base of transistor 122 is coupled to node 102. The collector of transistor 122 is coupled to the drain of a p-channel MOS transistor 124. The gate of transistor 124 is coupled to the BG signal. The source and substrate contact of transistor 124 are coupled to the $V_{cc}$ supply voltage. The collector of transistor 122 is coupled to the base of a PNP bipolar transistor 126. The emitter of transistor 126 is coupled to the $V_{cc}$ supply voltage through a 2 kiloohm resistor 128. The base of transistor 126 is coupled to the base and collector of a PNP transistor 127. The emitter of transistor 127 is coupled to the $V_{cc}$ supply voltage through a 2 kiloohm resistor 129. The collector of transistor 126 is coupled to the drain of transistor 88 and supplies the reference current 34 described previously with reference to FIG. 2.

In operation, the circuit 36 will produce a temperature constant reference current 34. Circuit 36 is enabled by the BG and BGN signals. Transistor 50 provides the pull-up bias current through resistor 74. Transistor 76, 78 and 80 act as a $3 \times V_{BE}$ voltage level clamp on the node between resistor 74 and resistor 72 such that the voltage across resistor 72 produces a current of about 13 microamps. This current is substantially independent of $V_{cc}$ to allow for better power supply rejection. Approximately one $V_{BE}$ voltage drop is developed across resistor 64 which results in a collector current from transistor 62 on the order of 35 to 87 microamps. This current is mirrored out of the collectors of transistors 54, 56 and 98. The current from transistor 98 sets the collector current in transistor 112. The current from transistor 56 is mirrored by transistors 90, 92 and 94 for twice the current from the collector of transistor 94. According to the teachings of the present invention, the delta $V_{BE}$ voltage is set by the reference current of approximately 50 microamps through transistor 122 into the array formed by resistors 114 and 120. It is not critical that the collector currents in transistors 108 and 112 remain temperature stable as these collector currents do not supply the reference current. According to the embodiment illustrated in FIG. 3, transistor 108 is on the order of four times the size of transistor 112. With the collector currents of transistors 108 and 112 set the same, the emitter current density of transistor 112 is four times the emitter current density of transistor 108 and the delta $V_{BE}$ voltage drop between transistors 108 and 112 will be across resistors 114 and 120. The temperature coefficient of resistors 114 and 120 is positive and substantially equal to the temperature coefficient of the delta $V_{BE}$. The combined temperature coefficient of resistors 114 and 120 is derived by constructing resistor 3.14 as a deep lightly doped n-well resistor having a temperature coefficient more positive than the temperature coefficient of the delta $V_{BE}$. In addition, resistor 120 is constructed as a conventional base resistor having a temperature coefficient less positive than that of the delta $V_{BE}$ such that the combined temperature coefficient is the same as that for the delta $V_{BE}$. Resistors 114 and 120 may comprise fuse tuneable arrays of resistive elements to allow for their values to be adjusted after manufacture. Accordingly, the current set in resistors 114 and 120 is mirrored from transistor 122 by transistors 126 and 127 to give a current in the reference current 34 having a zero temperature coefficient.

Figure 4:
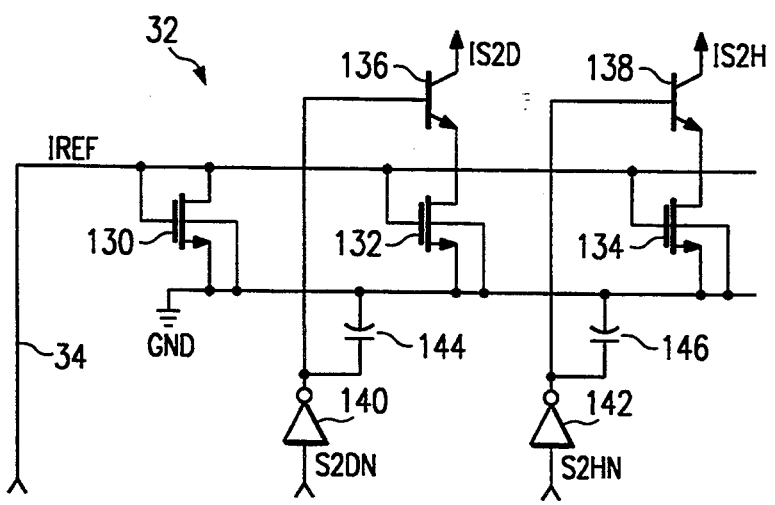
FIG. 4 is a schematic diagram of an output current mirror cell constructed according to the teachings of the present invention.

FIG. 4 is a schematic illustration of a portion of central output current mirror circuit 32. Circuit 32 receives the reference current signal 34. The reference current signal 34 is coupled to the gate of a n-channel MOS field effect transistor 130. Transistor 130 has its substrate contact and source coupled to ground potential and its gate and drain coupled to the reference current signal 34. The gate of transistor 130 is coupled to the gates of n-channel MOS field effect transistors 132 and 134. The source and backgate contacts of transistors 132 and 134 are coupled to ground potential. The drain of transistor 132 is coupled to the emitter of an NPN bipolar transistor 136. The drain of transistor 134 is coupled to the emitter of an NPN bipolar transistor 138. The collector of transistor 136 comprises a first output current which may be transmitted to an output driver such as output drivers 38 through 46 discussed previously with reference to FIG. 2. The collector of transistor 138 transmits a second output current which may be used in a similar fashion.

Circuit 32 receives logic level signals from register 30, two of which are shown in FIG. 4. The first logic level signal is received at the input of an inverter 140. The output of inverter 140 is coupled to the base of transistor 136. A second signal received from register 30 is received in circuit 32 at the input of an inverter 142 whose output is coupled to the base of transistor 138. The outputs of inverters 140 and 142 are respectively coupled to ground potential through a pair of 9.5 picofarad capacitors 144 and 146. The supply voltage of 140 and 142 is about 1.6 volts so the bases of transistors 136 and 138 will be driven to a high of 1.6 volts and the transistors 136 and 138 will not saturate.

In operation, the transistor 130 establishes the gate voltage in response to the reference current 34. Transistors 132 and 134 are sized proportionately to transistor 130 in order to set the currents through transistors 136 and 138 at desired levels proportionate to the reference current 34. For example, the current from the collector of transistor 136 may be directly proportional to the reference current 34 due to the ratio of the size of transistor 132 to transistor 130. Due to the direct ratio of the current levels, the current from transistor 136 will exhibit the same zero temperature coefficient as was the case with the reference current 34. The current output to the various output drivers such as the current output from transistors 136 and 138 can therefore be used by peripheral systems without the necessity of accounting for temperature variations in the current supply to the output drivers and the peripheral systems.

FIG. 5 is a schematic illustration of an output driver circuit such as output driver circuit 38 described with reference to FIG. 2. Circuit 38 shown in FIG. 5 is configured according to the teachings of the present invention to be especially adaptable to dealing with the currents required to drive an inductive load such as, for example, an external NPN bipolar transistor operating to drive the primary winding of a transformer. Such a transformer is a large inductive load which can pull the output pin below ground potential through the base and collector of the external NPN transistor when the transformer secondary load stops conducting. In one embodiment of the present invention, the circuit 38 with an external NPN transistor is used to drive the primary winding of a transformer which then transfers its voltage to a secondary winding to charge a high voltage capacitor. When the secondary load stops conducting, the secondary coupling to the transformer primary, the primary can pull the circuit 38 output below ground potential. If this negative voltage is not accounted for, substrate diodes within the driver circuit will turn on. If this process if left unchecked, the entire system can latch up due to the stray substrate currents. The design of circuit 38 prevents the substrate currents from occurring by turning on certain devices within circuit 38 to prevent the substrate currents from forming.

Circuit 38 receives a ICHG signal from output current mirror 32. The ICHG signal is on the order of 200 microamps and is routed to the collector of a PNP bipolar transistor 150. Transistor 150 has its emitter coupled to the $V_{cc}$ supply voltage through a 1 kiloohm resistor 152. The ICHG signal is also coupled to the base of a PNP bipolar transistor 154. The collector of transistor 154 is coupled to ground potential. The emitter of transistor 154 is coupled to the base of transistor 150 through a 500 ohm resistor 156. The base of transistor 150 is coupled to the base of a PNP bipolar transistor 158. The emitter of transistor 158 is coupled to $V_{cc}$ supply voltage through a 50 ohm resistor 160.

Circuit 38 also receives an IT2 control signal from the output current mirror 32 that is on the order of 100 microamps. The IT2 signal is coupled to the base and collector of a PNP bipolar transistor 162. The emitter of transistor 162 is coupled to the $V_{cc}$ supply voltage through a 2 kiloohm resistor 164. Circuit 38 also receives a QCHG signal output from circuit 30. The QCHG signal is coupled to the gate of a p-channel MOS field effect transistor 166. The source and substrate contact of transistor 166 is coupled to the $V_{cc}$ supply voltage through a 2 kiloohm resistor 168. The drain of transistor 166 is coupled to the base of transistor and to the base of a PNP bipolar transistor 170. The emitter of transistor 170 is coupled to the $V_{cc}$ supply voltage through a 1 kiloohm resistor 172.

The QCHG signal is also coupled to the gate of a p-channel MOS field effect transistor 174. The source and substrate contact of transistor 174 are coupled to $V_{cc}$ supply voltage through resistor 168. The drain of transistor 174 is coupled to the base of transistor 150 and the base of transistor 158. The gate of transistor 174 is also coupled to the gate of a p-channel MOS field effect transistor 176. The source and substrate contact of transistor 176 are coupled to the $V_{cc}$ supply voltage through resistor 168. The drain of transistor 176 is coupled to the ICHG signal and to the base of transistor 154.

The collector of transistor 170 is coupled to the base of a Schottky NPN bipolar transistor 178. The collector of transistor 178 is coupled to the collector of transistor 158 and to the collector of an NPN bipolar transistor 180. The emitter of transistor 178 is coupled to the base and collector of an NPN bipolar transistor 182. The emitter of transistor 182 is coupled to ground potential. The base of transistor 178 is coupled to the drain of an n-channel MOS field effect transistor 184. The source and substrate contact of transistor 184 are coupled to ground potential. The gate of transistor 184 is coupled to a T1 control signal.

The collector of transistor 180 is coupled to the base of transistor 180 through a 10 kiloohm resistor 186. The collector of transistor 180 is coupled to the base of an NPN bipolar transistor 188. The collector of transistor 188 is coupled to the $V_{cc}$ supply circuit. The emitter of transistor 188 is coupled to the base of transistor 180. The base of transistor 180 is coupled to the emitter of transistor 180 through a 1 kiloohm resistor 190. The emitter of transistor 180 is coupled to ground potential through a 25 ohm resistor 192. The base of transistor 180 is coupled to the base of an NPN bipolar transistor 194. The base of transistors 180 and 194 are coupled to the base and emitter of an NPN bipolar transistor 196. The collector of transistor 196 is coupled to the collector of transistor 194. The emitter of transistor 194 generates the output signal and is coupled to ground potential through resistor 192. The emitter of transistor 194 is also coupled to the emitter of transistor 180.

In operation, transistors 180, 188, and 194 comprise an output mirror which drives the output pin to approximately 1 volt, the $V_{BE}$ of the external NPN transistor, when circuit 38 is on. Transistor 158 supplies approximately 4 milliamps to drive the output mirror comprising transistors 180, 188 and 194. The ICHG signal is mirrored by transistor 150 to transistor 158 in order to set up the 4 milliamp current from the collector of transistor 158.

The circuit 38 is controlled using the T1 signal. When the T1 signal is active, transistor 184 is turned on. When transistor 184 is turned on, the base of Schottky transistor 178 is pulled low—turning transistor 178 off. When transistor 178 is off, transistor 158 supplies current to the output mirror described previously. When the T1 signal is low, transistor 184 is off. In this configuration, transistor 170 will pull the base voltage of transistor 178 high—turning on transistor 178. Due to the diode configuration of transistor 182, the base of transistor 178 is on the order of 1.6 volts. Accordingly, all 4 milliamps output by transistor 158 will pass through transistor 178. This condition will continue as long as the output pin remains above ground potential.

As discussed previously, however, if a large inductive load is coupled to the output pin, the inductive load can pull the output pin significantly below ground potential to on the order of negative 0.4 volts. If a negative voltage of about 0.7 volts is reached, conventional driver circuits can generate substrate currents that can cause latch-up in integrated devices. According to the teachings of the present invention, however, if the output pin drops significantly below ground potential, transistor 178 will turn off. If transistor 178 is off, the 4 milliamps generated by transistor 158 will once again be input into the output mirror comprising transistors 180, 188 and 194. Accordingly, the output current is driven through active devices at a voltage less than that required to activate substrate diodes. In this manner, the inductive kick-back from the output pin is compensated for without the danger of turning on substrate diodes and creating substrate currents which may result in latch-up in the integrated device.

Accordingly, an integrated control circuit is provided that allows for a central current reference circuit that supplies a current reference signal that enjoys a zero temperature coefficient. This current reference signal can be proportionately mirrored to a variety of output drivers to allow for the driving of peripheral systems with exact current requirements. Due to the fact that the reference current will not exhibit substantial variations with respect to temperature, the variability in the current supplied to the output drivers is small. As such, the output drivers can be designed to minimize the waste of current and power dissipation in the integrated system.

In addition, an output driver circuit is provided that compensates for the effect a large inductive load can have on an output pin coupled to the control circuit of the present invention. The negative voltage on the output pin which can result in substrate currents in ordinary circuits is compensated for by shunting the induced currents through active devices at voltages lower than the voltage required to turn on substrate diodes. In this manner, substrate currents that can result in latch-up of the integrated system are avoided.

Although the present invention has been described in detail, it should be understood that certain variations, substitutions and alterations can be made to the descriptions and examples given herein without departing from the spirit and scope of the present invention which is solely defined by the appended claims.

What is claimed is:

1. An integrated circuit operable to supply an output current to a load through a load pin, the circuit comprising:
   a current mirror circuit coupled to the load pin and operable to provide output current to the load through the load pin responsive to an input current signal;
   a shunting means operable to receive a control signal and control said local current mirror circuit;
   said shunting means comprising a Schottky transistor operable to shunt said input current signal away from said current mirror circuit, said Schottky transistor operable to cease conducting when the voltage of the load pin falls below a predetermined voltage level; and
   said local current mirror circuit operable to provide current through the load pin when the voltage of the load pin falls below said predetermined level.

2. The integrated circuit of claim 1 and further comprising:
   a output current mirror circuit operable to generate said input current signal responsive to a reference current; and
   a central current reference circuit operable to generate said reference current such that said reference current has a temperature coefficient substantially equal to zero.

3. The integrated circuit of claim 2 and further comprising:
   a control register comprising a plurality of data storage locations coupled to said central current reference circuit and said output current mirror circuit, one of said data storage locations operable to control the transmission of said input current signal to said current mirror circuit from said output current mirror circuit.

4. The integrated circuit of claim 1 wherein said predetermined voltage level comprises ground potential and wherein said Schottky transistor comprises an emitter, the integrated circuit further comprising a bipolar transistor having a base and collector coupled to said emitter of said Schottky transistor and having an emitter connected to ground potential, said bipolar transistor operable to provide bias for said Schottky transistor.

5. The integrated circuit of claim 1 wherein the load coupled to the load pin comprises a primary winding of a transformer.

6. A control system operable to supply current to a load through a load pin, comprising:
   a control circuit operable to generate an output control data;
   a current mirror circuit coupled to the load pin and operable to provide output current to the load through the load pin responsive to an input current signal;
   local control circuitry operable to receive a control signal and control said current mirror circuit;
   said shunting means comprising a Schottky transistor operable to conduct said input current signal away from said current mirror circuit, said Schottky transistor operable to cease conducting when the voltage of the load pin falls below a predetermined voltage level;
   said current mirror circuit operable to provide current through the load pin when the voltage of the load pin falls below said predetermined level;
   a output current mirror circuit operable to generate said input current signal responsive to a reference current;
   a central current reference circuit operable to generate said reference current such that said reference current has a temperature coefficient substantially equal to zero;
   a control register operable to receive and store the control data output from said control circuit in a plurality of data storage locations coupled to said central current reference circuit and said output current mirror circuit, one of said data storage locations operable to control the transmission of said input current signal to said current mirror circuit from said central output current mirror circuit.

7. The integrated circuit of claim 6 wherein said predetermined voltage level comprises ground potential and wherein said Schottky transistor comprises an emitter, the integrated circuit further comprising a bipolar transistor having a base and collector coupled to said emitter of said Schottky transistor and having an emitter connected to ground potential, said bipolar transistor operable to provide bias for said Schottky transistor.

8. The integrated circuit of claim 6 wherein the load coupled to the load pin comprises a primary winding of a transformer.

9. A method of providing an output current from an output driver circuit to a load through a load pin, comprising the steps of:
   receiving in the output driver circuit an input current signal from a output current mirror circuit;
   generating in the output driver circuit the output current proportional to the input current signal using a current mirror circuit;
   receiving in the output driver circuit a control signal;
   shunting the input current signal away from the current mirror circuit through a shunt current path responsive to said control signal; and
   shutting off the shunt current path and returning the input current signal to the current mirror circuit if the voltage of the load pin falls below a predetermined voltage level.

10. The method of claim 9 wherein said step of shunting the input current signal comprises the step of shunting the input current signal through a Schottky transistor.

11. The method of claim 9 wherein said step of receiving an input current signal comprises the step of receiving an input current signal having a temperature coefficient substantially equal to zero.

12. The method of claim 9 and further comprising the steps of:
   generating a reference current in a central current reference circuit such that the reference current has a temperature coefficient substantially equal to zero;
   transmitting the reference current to a output current mirror circuit;
   receiving and storing control data; and
   generating the input current signal proportional to the reference current and transmitting the input signal to the output driver circuit responsive to selected portions of the control data.

* * * * *